United States Patent
Godo

(10) Patent No.: US 10,730,402 B2
(45) Date of Patent: Aug. 4, 2020

(54) ELECTRICAL CONTROL SYSTEM

(71) Applicant: LG Chem, Ltd., Seoul (KR)

(72) Inventor: Edvin Godo, Troy, MI (US)

(73) Assignee: LG Chem, Ltd., Seoul (KR)

( * ) Notice: Subject to any disclaimer, the term of this patent is extended or adjusted under 35 U.S.C. 154(b) by 397 days.

(21) Appl. No.: 15/814,665

(22) Filed: Nov. 16, 2017

(65) Prior Publication Data

US 2019/0143834 A1 May 16, 2019

(51) Int. Cl.
  *B60L 58/21* (2019.01)
  *G05F 1/571* (2006.01)
  *G01R 31/00* (2006.01)
  *H01M 10/42* (2006.01)
  *H01M 10/48* (2006.01)

(52) U.S. Cl.
  CPC ............ *B60L 58/21* (2019.02); *G01R 31/007* (2013.01); *G05F 1/571* (2013.01); *H01M 10/425* (2013.01); *H01M 10/48* (2013.01); *H01M 2010/4271* (2013.01)

(58) Field of Classification Search
  CPC ....... B60L 58/21; G01R 31/007; G05F 1/571; H01M 10/425; H01M 10/48; H01M 2010/4271
  See application file for complete search history.

(56) References Cited

U.S. PATENT DOCUMENTS

| 6,274,950 B1* | 8/2001 | Gottlieb | G01R 31/3648 307/66 |
| 8,861,161 B2 | 10/2014 | Grupido | |
| 9,592,738 B1* | 3/2017 | Paryani | B60L 58/10 |
| 2007/0190369 A1* | 8/2007 | Leach | H02J 7/0018 429/9 |

(Continued)

FOREIGN PATENT DOCUMENTS

| EP | 1533881 A2 | 5/2005 |
| EP | 3126185 A1 | 2/2017 |

(Continued)

OTHER PUBLICATIONS

U.S. Appl. No. 15/385,242, filed Dec. 20, 2016 entitled Systems for Determining a Voltage Out-Of-Range High Condition and a Voltage Out-Of-Range Low Condition of a Battery Module.

(Continued)

*Primary Examiner* — Regis J Betsch
(74) *Attorney, Agent, or Firm* — Buckert Patent & Trademark Law Firm PC; John F. Buckert

(57) ABSTRACT

An electrical control system is provided. A first slave IC generates a first message indicating that a first battery cell has an overvoltage condition that is received by a communication IC. The communication IC sets a fault line coupled between the communication IC and a secondary microcontroller to a first logic level indicating that an overvoltage condition has been detected. The secondary microcontroller sends a message to a primary microcontroller indicating that (Continued)

the overvoltage condition has been detected in response on the fault line having the first logic level. The primary microcontroller commands a contactor control system to set each of the first and second contactors to the open operational state, in response to receiving the message.

10 Claims, 4 Drawing Sheets

(56) References Cited

U.S. PATENT DOCUMENTS

| | | | |
|---|---|---|---|
| 2011/0127964 A1* | 6/2011 | Nishida | H01M 10/441 320/118 |
| 2011/0140669 A1* | 6/2011 | Murakami | B60L 3/0038 320/134 |
| 2012/0154967 A1 | 6/2012 | Hong | |
| 2013/0006453 A1* | 1/2013 | Wang | B60W 50/0205 701/22 |
| 2013/0346783 A1 | 12/2013 | Weber et al. | |
| 2014/0001833 A1 | 1/2014 | Grupido | |
| 2014/0152261 A1* | 6/2014 | Yamauchi | H01M 10/425 320/118 |
| 2014/0292072 A1* | 10/2014 | Nakanishi | G01R 31/3842 307/9.1 |
| 2017/0315177 A1 | 11/2017 | Yoon et al. | |
| 2018/0024172 A1* | 1/2018 | Katrak | G01R 19/1659 307/130 |
| 2018/0226816 A1 | 8/2018 | Na et al. | |

FOREIGN PATENT DOCUMENTS

| | | |
|---|---|---|
| GB | 2546789 A | 8/2017 |
| JP | 2013545424 A | 12/2013 |
| KR | 101146433 B1 | 5/2012 |
| KR | 101473387 B1 | 12/2014 |
| KR | 101725671 B1 | 4/2017 |
| KR | 101749246 B1 | 6/2017 |

OTHER PUBLICATIONS

European Search Report for European Patent Application No. 18878126A dated Mar. 9, 2020.

* cited by examiner

ELECTRICAL CONTROL SYSTEM

BACKGROUND

The inventor herein has recognized a need for an improved electrical control system for a vehicle that has redundant microcontrollers for opening contactors coupled to a vehicle powertrain when at least one battery cell in the vehicle has an overvoltage condition.

SUMMARY

An electrical control system in accordance with an exemplary embodiment is provided. The electrical control system includes a first slave IC that monitors a voltage of a first battery cell. The electrical control system further includes a second slave IC that monitors a voltage of a second battery cell. The electrical control system further includes a primary microcontroller and a secondary microcontroller that operably communicate with one another. The electrical control system further includes a communication IC that operably communicates with the first and second slave ICs and the primary microcontroller. The electrical control system further includes a contactor control system that is operably coupled to the primary microcontroller and the secondary microcontroller, and to a first contactor and a second contactor. The first slave IC generates a first message indicating that the first battery cell has an overvoltage condition that is received by the communication IC. The communication IC sets a fault line coupled between the communication IC and the secondary microcontroller to a first logic level indicating that an overvoltage condition has been detected in response to the first message. The secondary microcontroller sends a second message to the primary microcontroller indicating that the overvoltage condition has been detected in response on the fault line having the first logic level. The primary microcontroller sends a third message through a communication bus transceiver IC to a vehicle controller indicating that the primary microcontroller will set each of the first and second contactors to an open operational state, in response to receiving the second message. The primary microcontroller commands the contactor control system to set each of the first and second contactors to the open operational state, in response to receiving the second message.

DETAILED DESCRIPTION

Figure 1:
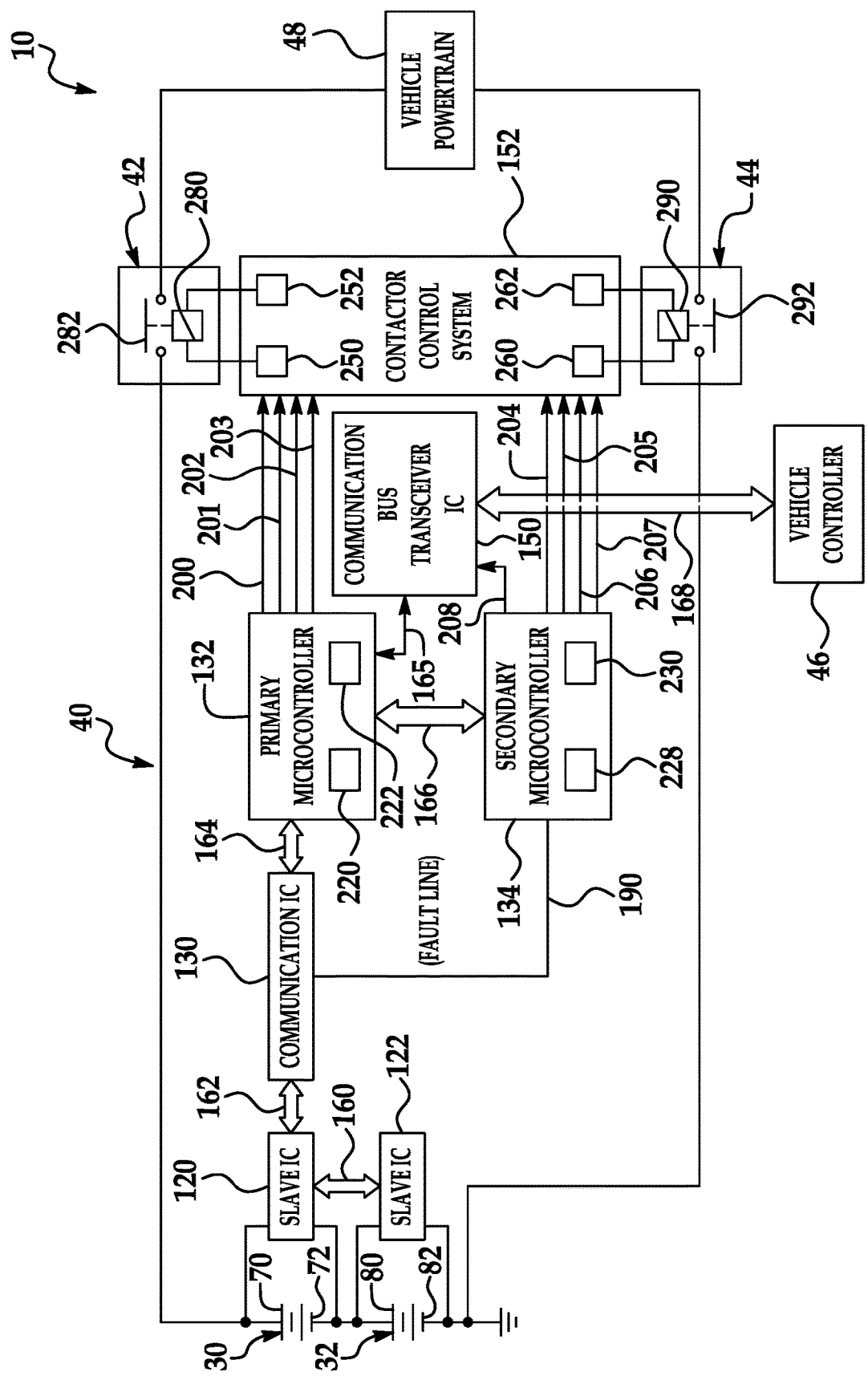
FIG. 1 is a schematic of a vehicle having an electrical control system in accordance with an exemplary embodiment.
Figure 2:
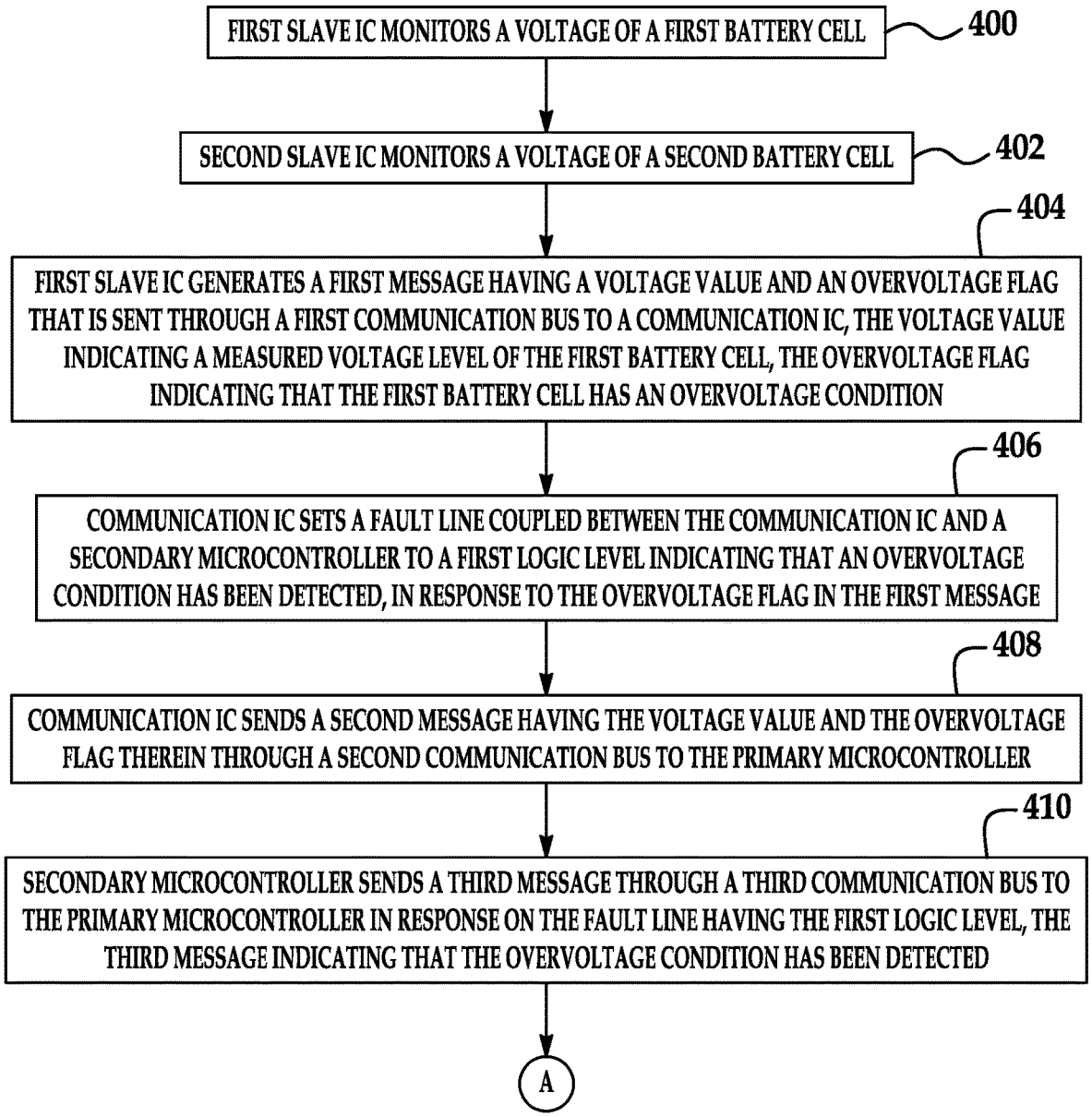
FIGS. 2-4 are flowcharts of a method for controlling contactors in the vehicle utilizing the electrical control system of FIG. 1 in accordance with another exemplary embodiment.
Figure 3:
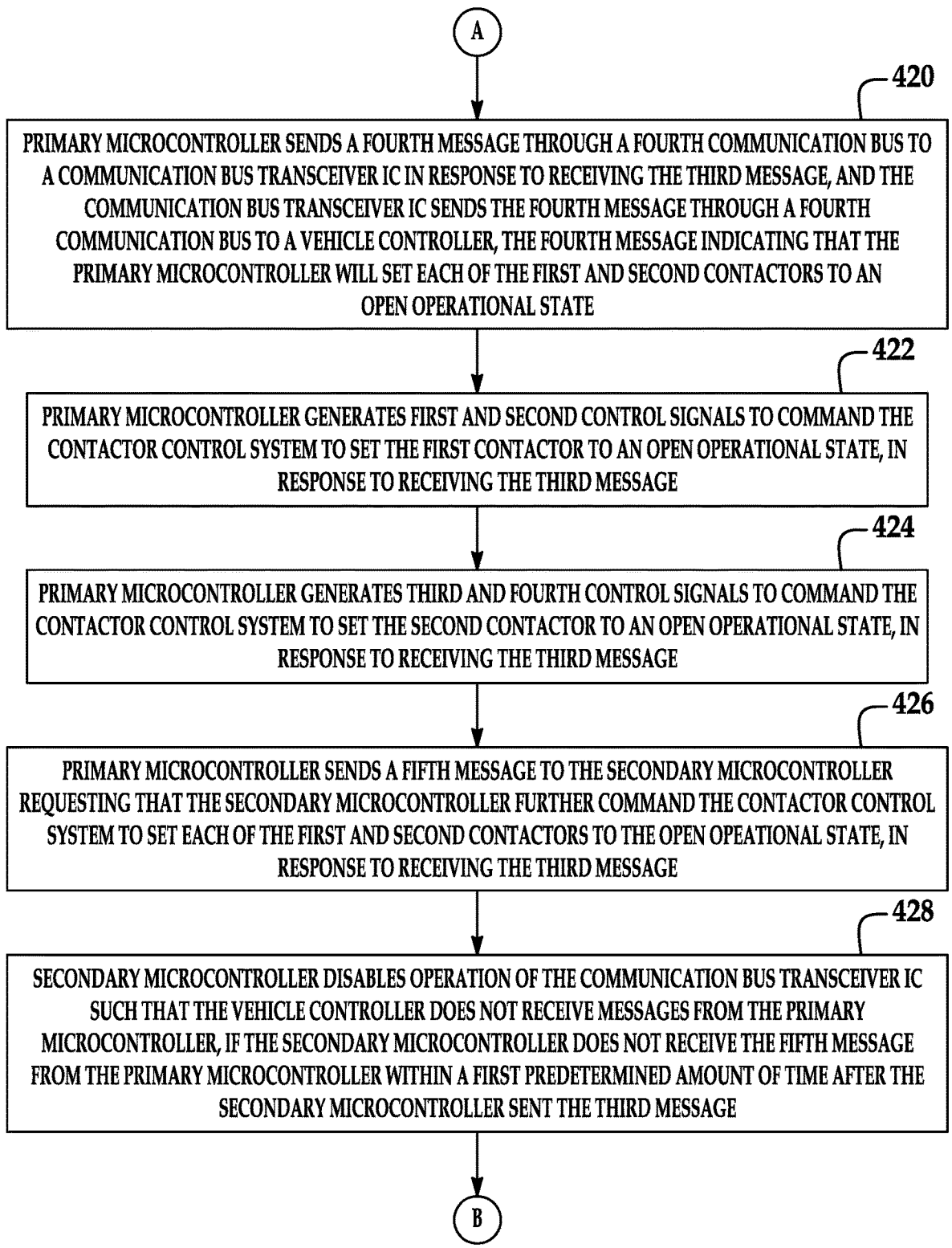
Figure 4:
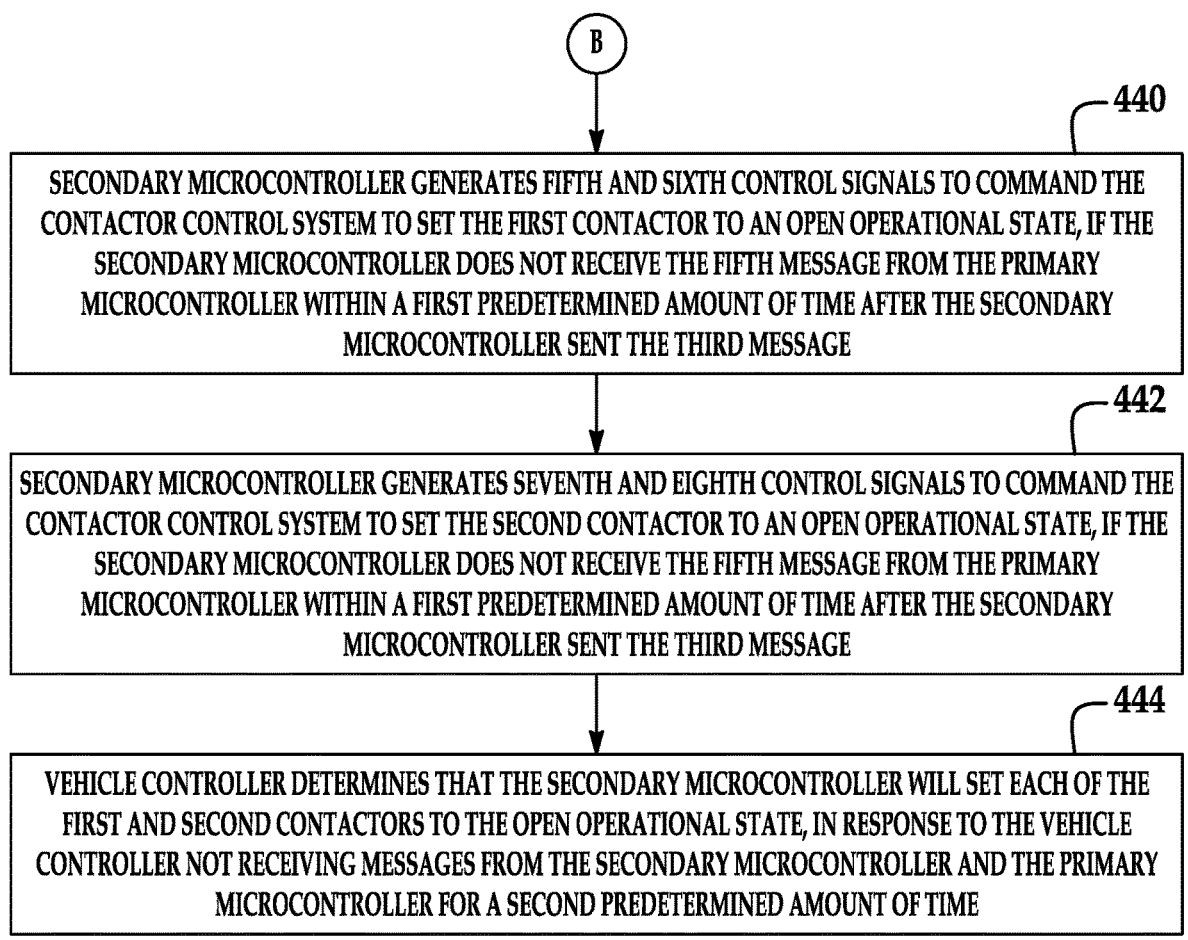

Referring to FIG. 1, a vehicle 10 is provided. The vehicle 10 includes a battery cell 30, a battery cell 32, an electrical control system 40, contactors 42, 44, a vehicle controller 46, and a vehicle powertrain 48.

An advantage of the electrical control system 40 is that the system has a primary microcontroller 132 and a secondary microcontroller 134 which can each open the contactors 42, 44 when at least one of the battery cells 30, 32 have an overvoltage condition.

For purposes of understanding, some of the terms utilized herein will be described.

The term "node" or "electrical node" is a region or a location in an electrical circuit.

The term "signal" refers to one of an electrical voltage, an electrical current, and a binary value.

The term "IC" refers to an integrated circuit.

The term "low logic level" corresponds to a voltage level representing a binary 0.

The term "high logic level" corresponds to a voltage level representing a binary 1.

The battery cell 30 has a positive terminal 70 and a negative terminal 72. In an exemplary embodiment, the battery cell 30 generates a predetermined voltage level between the positive terminal 70 and the negative terminal 72. The positive terminal 70 is electrically coupled to a first side of the contactor 42. The negative terminal 72 is electrically coupled to a positive terminal 80 of the battery cell 32.

The battery cell 32 has a positive terminal 80 and a negative terminal 82. In an exemplary embodiment, the battery cell 32 generates a predetermined voltage level between the positive terminal 80 and the negative terminal 82. The positive terminal 80 is electrically coupled to the negative terminal 72 of the battery cell 30. The negative terminal 82 is electrically coupled to a first side of the contactor 44 and to electrical ground. In an alternative embodiment, it is noted that additional battery cells could be coupled electrically in series with the battery cells 30, 32.

The electrical control system 40 is provided to monitor output voltages of the battery cells 30, 32 and to control operation of the contactors 42, 44. The electrical control system 40 includes a slave IC 120, a slave IC 122, a communication IC 130, a primary microcontroller 132, a secondary microcontroller 134, a communication bus transceiver IC 150, a contactor control system 152, communication busses 160, 162, 164, 165, 166, 168, a fault line 190, and control lines 200, 201, 202, 203, 204, 205, 206, 207.

The slave IC 120 monitors a voltage of the battery cell 30. The slave IC 120 is electrically coupled to and between the positive terminal 70 and the negative terminal 72 of the battery cell 30. Further, the slave IC 120 is operably coupled to both the communication bus 162 and the communication bus 160. The slave IC 120 communicates with the communication IC 130 utilizing the communication bus 162. Further, the slave IC 120 communicates with the slave IC 122 utilizing the communication bus 160. If the slave IC 120 determines that an output voltage of the battery cell 30 has an overvoltage condition (i.e., the output voltage is greater than a desired voltage level), then the slave IC 120 generates a message having a voltage value indicating a measured voltage level of the battery cell 30, and an overvoltage flag indicating that the battery cell 30 has an overvoltage condition. The message is sent through the communication bus 162 to the communication IC. Also, if the slave IC 120 receives a message from the slave IC 122 having a voltage value indicating a measured voltage level of the battery cell 32, and an overvoltage flag indicating that the battery cell 32 has an overvoltage condition, then the slave IC 120 generates a message having a voltage value indicating a measured voltage level of the battery cell 32, and an overvoltage flag indicating that the battery cell 32 has an overvoltage condition, that is sent through the communication bus 162 to the communication IC.

The slave IC 122 monitors a voltage of the battery cell 32. The slave IC 122 is electrically coupled to and between the positive terminal 80 and the negative terminal 82 of the battery cell 32. Further, the slave IC 122 is operably coupled to the communication bus 160. If the slave IC 122 determines that an output voltage of the battery cell 32 has an overvoltage condition (i.e., the output voltage is greater than a desired voltage level), then the slave IC 122 generates a message having a voltage value indicating a measured voltage level of the battery cell 32, and an overvoltage flag indicating that the battery cell 32 has an overvoltage condition, that is sent through the communication bus 160 to the slave IC 120.

The communication IC 130 is operably coupled to the communication bus 162, the communication bus 164, and the fault line 190. When the communication IC 130 receives a message from the slave IC 120 via the communication bus 162, the communication IC 130 sends the message through the communication bus 164 to the primary microcontroller 132. Further, when a message from the slave IC 120 indicates an overvoltage condition of the battery cell 30 or the battery cell 32, the communication IC 130 sets the fault line 190 to a high logic level indicating an overvoltage condition has been detected. Otherwise, the communication IC 130 sets the fault line 190 to a low logic level.

The primary microcontroller 132 is operably coupled to the communication bus 164, the communication bus 165, and the control lines 200, 201, 202, 203. The primary microcontroller 132 includes a microprocessor 220 that is operably coupled to a memory device 222. The memory device 222 stores data and software instructions for performing the operational steps of the primary microcontroller 132 described hereinafter. The primary microcontroller 132 communicates with the communication IC 130 utilizing the communication bus 164. Further, the primary microcontroller 132 communicates with the secondary microcontroller 134 utilizing the communication bus 166. Also, the primary microcontroller 132 communicates with the communication bus transceiver IC 150 utilizing the communication bus 165.

The primary microcontroller 132 generates first and second control signals on the control lines 200, 201, respectively to command the voltage drivers 250, 252, respectively, in the contactor control system 152 to energize a coil 280 in the contactor 42 to transition a contact 282 in the contactor 42 to a closed operational state. Alternately, the primary microcontroller 132 generates third and fourth control signals on the control lines 200, 201, respectively to command the voltage drivers 250, 252, respectively, in the contactor control system 152 to de-energize the coil 280 in the contactor 42 to transition the contact 282 in the contactor 42 to an open operational state.

Further, the primary microcontroller 132 generates third and fourth control signals on the control lines 202, 203, respectively to command the voltage drivers 260, 262, respectively, in the contactor control system 152 to energize a coil 290 in the contactor 44 to transition a contact 292 in the contactor 44 to a closed operational state. Alternately, the primary microcontroller 132 can generate fifth and sixth control signals on the control lines 202, 203, respectively to command the voltage drivers 260, 262, respectively, in the contactor control system 152 to de-energize the coil 290 in the contactor 42 to transition the contact 282 in the contactor 42 to an open operational state.

The primary microcontroller 132 communicates with the communication bus transceiver IC 150 utilizing the communication bus 165. Further, the primary microcontroller 132 communicates with the vehicle controller 46 utilizing the communication bus 165, the communication bus transceiver IC 150, and the communication bus 168. The additional functionality of the primary microcontroller 132 will be described in greater detail hereinafter.

The secondary microcontroller 134 is operably coupled to the communication bus 166, the fault line 190, and the control lines 204, 205, 206, 207, 208. The secondary microcontroller 134 includes a microprocessor 228 that is operably coupled to a memory device 230. The memory device 230 stores data and software instructions for performing the operational steps of the secondary microcontroller 134 described hereinafter. The secondary microcontroller 134 communicates with the primary microcontroller 132 utilizing the communication bus 166.

Further, the secondary microcontroller 134 generates first and second control signals on the control lines 204, 205, respectively to command the voltage drivers 250, 252, respectively, in the contactor control system 152 to energize a coil 280 in the contactor 42 to transition a contact 282 in the contactor 42 to a closed operational state. Alternately, the secondary microcontroller 134 generates third and fourth control signals on the control lines 204, 205, respectively, to command the voltage drivers 250, 252, respectively, in the contactor control system 152 to de-energize the coil 280 in the contactor 42 to transition the contact 282 in the contactor 42 to an open operational state.

Also, the secondary microcontroller 134 generates third and fourth control signals on the control lines 206, 207, respectively to command the voltage drivers 260, 262, respectively, in the contactor control system 152 to energize a coil 290 in the contactor 44 to transition a contact 292 in the contactor 44 to a closed operational state. Alternately, the primary microcontroller 132 generates fifth and sixth control signals on the control lines 206, 207, respectively to command the voltage drivers 260, 262, respectively, in the contactor control system 152 to de-energize the coil 290 in the contactor 42 to transition the contact 282 in the contactor 42 to an open operational state.

Further, the secondary microcontroller 134 generates an enable control signal on the control line 208 having a first logic level to enable operation of the communication bus transceiver IC 150. Further, the secondary microcontroller 134 generates a disable control signal on the control line 208 having a second logic level to disable operation of the communication bus transceiver IC 150. The additional functionality of the secondary microcontroller 134 will be described in greater detail hereinafter.

The communication bus transceiver IC 150 is utilized to facilitate communication between the primary microcontroller 132 and the vehicle controller 46. When the communication bus transceiver IC 150 receives an enable control signal from the secondary microcontroller 134, the communication bus transceiver IC 150 allows messages to be transmitted between the primary microcontroller 132 and the vehicle controller 46. Alternately, when the communication bus transceiver IC 150 receives a disable control signal from the secondary microcontroller 134, the communication bus transceiver IC 150 does not transmit messages between the primary microcontroller 132 and the vehicle controller 46. The communication bus transceiver IC 150 is operably coupled to the communication bus 165 which is further operably coupled to the primary microcontroller 132. Further, the communication bus transceiver IC 150 is operably coupled to the communication bus 168 which is further operably coupled to the vehicle controller 46.

The contactor control system 152 is provided to control operation of the contactors 42, 44. The contactor control system 152 is operably coupled to the primary microcontroller 132, the secondary microcontroller 134, the contactor 42, and the contactor 44. The contactor control system 152 includes voltage drivers 250, 252, 260, 262. Further, the voltage drivers 250, 252 are electrically coupled to the contactor coil 280 of the contactor 42. During operation, when the voltage drivers 250, 252 energize the contactor coil 280, the contact 282 transitions to a closed operational state. Alternately when the voltage drivers 250, 252 de-energize the contactor coil 280, the contact 282 transitions to an open operational state. When the voltage drivers 260, 262 energize the contactor coil 290, the contact 292 transitions to a closed operational state. Alternately when the voltage drivers 260, 262 de-energize the contactor coil 290, the contact 292 transitions to an open operational state.

The contactors 42, 44 are provided to energize the vehicle powertrain 48 when the contactors 42, 44 each have a closed operational state, and to de-energize the vehicle powertrain 48 when the contactors 42, 44 each have an open operational state.

The contactor 42 includes the contactor coil 280 and the contact 282. The contactor coil 280 is electrically coupled to the voltage drivers 250, 252. The contact 282 is electrically coupled between the positive terminal of the battery cell 30 and a first end of the vehicle powertrain 48.

The contactor 44 includes the contactor coil 290 and the contact 292. The contactor coil 290 is electrically coupled to the voltage drivers 260, 262. The contact 292 is electrically coupled between the negative terminal 82 of the battery cell 32 and a second end of the vehicle powertrain 48.

The fault line 190 is an electrical line that is electrically coupled to and between the communication IC 130 and the secondary microcontroller 134. The communication IC 130 transitions the fault line to a first logic level when an overvoltage condition has been detected in the first battery cell 30 or the second battery cell 32. Otherwise, the communication IC 130 sets the fault line to a second logic level.

In an alternative embodiment, the vehicle 10 includes a plurality of additional battery cells coupled in series with the battery cells 30, 32. Further, the electrical control system 40 includes a plurality of additional slave ICs that monitor voltages of the plurality of additional battery cells, and which communicate with one another and also communicate with the slave ICs 120, 122.

Referring to FIGS. 1-4, a flowchart of a method for controlling the contactors 42, 44 utilizing the electrical control system 40 will now be explained.

At step 400, the slave IC 120 monitors a voltage of a battery cell 30. After step 400, the method advances to step 402.

At step 402, the slave IC 122 monitors a voltage of a battery cell 32. After step 402, the method advances to step 404.

At step 404, the slave IC 120 generates a first message having a voltage value and an overvoltage flag that is sent through a communication bus 162 to a communication IC 130. The voltage value indicates a measured voltage level of the battery cell 30. The overvoltage flag indicates that the battery cell 30 has an overvoltage condition. After step 404, the method advances to step 406.

At step 406, the communication IC 130 sets a fault line 190 coupled between the communication IC 130 and a secondary microcontroller 134 to a first logic level indicating that an overvoltage condition has been detected, in response to the overvoltage flag in the first message. After step 406, the method advances to step 408.

At step 408, the communication IC 130 sends a second message having the voltage value and the overvoltage flag therein through a communication bus 164 to the primary microcontroller 132. After step 408, the method advances to step 410.

At step 410, the secondary microcontroller 134 sends a third message through a communication bus 166 to the primary microcontroller 132 in response on the fault line 190 having the first logic level. The third message indicates that the overvoltage condition has been detected. After step 410, the method advances to step 420.

At step 420, the primary microcontroller 132 sends a fourth message through a communication bus 165 to a communication bus transceiver IC 150 in response to receiving the third message, and the communication bus transceiver IC 150 sends the fourth message through a communication bus 168 to a vehicle controller 46. The fourth message indicates that the primary microcontroller 132 will set each of the contactors 42, 44 to an open operational state. After step 420, the method advances to step 422.

At step 422, the primary microcontroller 132 generates first and second control signals to command the contactor control system 152 to set the contactor 42 to an open operational state, in response to receiving the third message. After step 422, the method advances to step 424.

At step 424, the primary microcontroller 132 generates third and fourth control signals to command the contactor control system 152 to set the contactor 44 to an open operational state, in response to receiving the third message. After step 424, the method advances to step 426.

At step 426, the primary microcontroller 132 sends a fifth message to the secondary microcontroller 134 requesting that the secondary microcontroller 134 further command the contactor control system 152 to set each of the contactors 42, 44 to the open operational state, in response to receiving the third message. After step 426, the method advances to step 428.

At step 428, the secondary microcontroller 134 disables operation of the communication bus transceiver IC 150 such that the vehicle controller 46 does not receive messages from the primary microcontroller 132, if the secondary microcontroller 134 does not receive the fifth message from the primary microcontroller 132 within a first predetermined amount of time after the secondary microcontroller 134 sent the third message. After step 428, the method advances to step 440.

At step 440, the secondary microcontroller 134 generates fifth and sixth control signals to command the contactor control system 152 to set the contactor 42 to an open operational state, if the secondary microcontroller 134 does not receive the fifth message from the primary microcontroller 132 within a first predetermined amount of time after the secondary microcontroller 134 sent the third message. After step 440, the method advances to step 442.

At step 442, the secondary microcontroller 134 generates seventh and eighth control signals to command the contactor control system 152 to set the contactor 44 to an open operational state, if the secondary microcontroller 134 does not receive the fifth message from the primary microcontroller 132 within a first predetermined amount of time after the secondary microcontroller 134 sent the third message. After step 442, the method advances to step 444.

At step 444, the vehicle controller 46 determines that the secondary microcontroller 134 will set each of the contactors 42, 44 to the open operational state, in response to the vehicle controller 46 not receiving messages from the secondary microcontroller 134 and the primary microcontroller 132 for a second predetermined amount of time. After step 444, the method is exited.

The electrical control system described herein provides a substantial advantage over other control systems. In particular, the electrical control system has a primary microcontroller and a secondary microcontroller which can each open the contactors when at least one of the battery cells have an overvoltage condition. Further, the electrical control systems notifies a vehicle controller that the contactors will be set to the open operational state by disabling operation of a communication bus transceiver IC.

While the claimed invention has been described in detail in connection with only a limited number of embodiments, it should be readily understood that the invention is not limited to such disclosed embodiments. Rather, the claimed invention can be modified to incorporate any number of variations, alterations, substitutions or equivalent arrangements not heretofore described, but which are commensurate with the spirit and scope of the invention. Additionally, while various embodiments of the claimed invention have been described, it is to be understood that aspects of the invention may include only some of the described embodiments. Accordingly, the claimed invention is not to be seen as limited by the foregoing description.

What is claimed is:

1. An electrical control system, comprising:
a first slave IC that monitors a voltage of a first battery cell;
a second slave IC that monitors a voltage of a second battery cell;
a primary microcontroller and a secondary microcontroller that operably communicate with one another;
a communication IC that operably communicates with the first and second slave ICs and the primary microcontroller;
a contactor control system that is operably coupled to the primary microcontroller and the secondary microcontroller, and to a first contactor and a second contactor;
the first slave IC generating a first message indicating that the first battery cell has an overvoltage condition, that is received by the communication IC;
the communication IC setting a fault line coupled between the communication IC and the secondary microcontroller to a first logic level indicating that an overvoltage condition has been detected in response to the first message;
the secondary microcontroller sending a second message to the primary microcontroller indicating that the overvoltage condition has been detected in response to the fault line having the first logic level;
the primary microcontroller sending a third message through a communication bus transceiver IC to a vehicle controller indicating that the primary microcontroller will set each of the first and second contactors to an open operational state, in response to receiving the second message;
the primary microcontroller commanding the contactor control system to set each of the first and second contactors to the open operational state, in response to receiving the second message;
the primary micorcontroller sending a fourth message to the secondary microcontroller requesting that the secondary microcontroller further command the contactor control system to set each of the first and second contactors to the open operational state, in response to receiving the second message; and
the secondary microcontroller disabling operation of the communication bus transceiver IC such that the vehicle controller does not receive messages from the secondary microcontroller and the primary microcontroller, if the secondary microcontroller does not receive the fourth message from the primary microcontroller within a first predetermined amount of time after the secondary microcontroller sent the second message.

2. The electrical control system of claim 1, wherein:
the vehicle controller determining that the secondary microcontroller will set each of the first and second contactors to the open operational state, in response to the vehicle controller not receiving messages from the secondary microcontroller and the primary microcontroller for a second predetermined amount of time.

3. The electrical control system of claim 1, wherein the secondary microcontroller further commanding the contactor control system to set each of the first and second contactors to the open operational state, if the secondary microcontroller does not receive the fourth message from the primary microcontroller within the first predetermined amount of time after the secondary microcontroller sent the second message.

4. The electrical control system of claim 1, wherein the primary microcontroller further commanding the contactor control system to set each of the first and second contactors to the open operational state, by de-energizing first and second contactor coils in the first and second contactors, respectively.

5. The electrical control system of claim 1, wherein the first and second contactors are electrically coupled to a vehicle powertrain.

6. The electrical control system of claim 1, further comprising another communication bus operably coupled between the primary microcontroller and the secondary microcontroller.

7. The electrical control system of claim 1, wherein:
the first slave IC further generating a fifth message with a measured voltage value therein, the measured voltage value indicating a measured voltage level of the first battery cell, that is received by the communication IC; and
the communication IC sending the fifth message with the measured voltage value to the primary microcontroller.

8. An electrical control system, comprising:
a first slave IC that monitors a voltage of a first battery cell;
a primary microcontroller and a secondary microcontroller that operably communicate with one another;
a communication IC that is external to the primary microcontroller and the secondary microcontroller, the communication IC operably communicates with the first slave IC utilizing a communication bus;
a fault line being an electrical line that is electrically coupled to and between the communication IC and the secondary microcontroller;
a contactor control system that is operably coupled to the primary microcontroller and the secondary microcontroller, and to a first contactor and a second contactor;
the first slave IC sending a first message indicating that the first battery cell has an overvoltage condition through the communication bus that is received by the communication IC;
the communication IC setting the fault line coupled between the communication IC and the secondary microcontroller to a first logic level indicating that the overvoltage condition has been detected in response to the first message;
the secondary microcontroller sending a second message to the primary microcontroller indicating that the overvoltage condition has been detected in response to the fault line having the first logic level;

the primary microcontroller commanding the contactor control system to set each of the first and second contactors to the open operational state, in response to receiving the second message.

9. The electrical control system of claim 8, wherein:

the secondary microcontroller disabling operation of a communication bus transceiver IC such that a vehicle controller does not receive messages from the secondary microcontroller and the primary microcontroller.

10. The electrical control system of claim 9, wherein:

the vehicle controller determining that the secondary microcontroller will set each of the first and second contactors to the open operational state, in response to the vehicle controller not receiving messages from the secondary microcontroller and the primary microcontroller for a predetermined amount of time.

* * * * *